US009608656B2

(12) United States Patent
Yuan et al.

(10) Patent No.: US 9,608,656 B2
(45) Date of Patent: Mar. 28, 2017

(54) SYMMETRICAL CAPACITOR ARRAYS SUCCESIVE APPROXIMATION REGISTER (SAR) ANALOG-TO-DIGITAL CONVERTER (ADC)

(71) Applicant: National University of Singapore, Singapore (SG)

(72) Inventors: Chao Yuan, Singapore (SG); Kian Ann Ng, Singapore (SG); Yong Ping Xu, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 15/224,986

(22) Filed: Aug. 1, 2016

(65) Prior Publication Data

US 2017/0033800 A1 Feb. 2, 2017

Related U.S. Application Data

(60) Provisional application No. 62/282,395, filed on Jul. 30, 2015.

(51) Int. Cl.
*H03M 1/34* (2006.01)
*H03M 1/12* (2006.01)
*H03M 1/38* (2006.01)

(52) U.S. Cl.
CPC ............ *H03M 1/1245* (2013.01); *H03M 1/38* (2013.01)

(58) Field of Classification Search
CPC ....... H03M 1/001; H03M 1/38; H03M 1/1245
USPC .................... 341/155, 172, 144, 122, 163
See application file for complete search history.

(56) References Cited

U.S. PATENT DOCUMENTS

| | | | | |
|---|---|---|---|---|
| 4,799,042 A | * | 1/1989 | Confalonieri | H03M 1/1047 341/118 |
| 5,767,801 A | * | 6/1998 | Okamoto | H03M 1/68 341/145 |
| 2010/0039303 A1 | * | 2/2010 | Tsukamoto | H03M 1/1061 341/150 |

(Continued)

OTHER PUBLICATIONS

Chen et al.; "A 9b 100MS/s 1.46m W SAR ADC in 65 nm CMOS," IEEE Asian Solid-State Circuits Conference, pp. 145-148, 2009.

(Continued)

*Primary Examiner* — Peguy Jean Pierre
(74) *Attorney, Agent, or Firm* — Occhiuti & Rohlicek LLP

(57) ABSTRACT

Analog-to-digital converter (ADC) circuitry includes a first binary-weighted capacitor array having a total capacitance of $2^{n-2}C$. The value of n represents number of bits of a digital signal that represents an analog signal. The ADC circuitry also includes a second binary-weighted capacitor array having a total capacitance of $2^{n-2}C$. In addition to that, the ADC circuitry further includes a comparator circuit having first and second terminals. The first terminal is coupled to the first binary-weighted capacitor array, and the second terminal is coupled to the second binary weighted capacitor array. The switching circuit within the second binary-weighted capacitor array may be configurable to couple a largest capacitance capacitor within the second binary-weighted capacitor array from remaining capacitors within the second binary weighted capacitor array.

20 Claims, 10 Drawing Sheets

(56) References Cited

U.S. PATENT DOCUMENTS

2010/0271245 A1* 10/2010 Thomas .................. H03M 1/06
                                                      341/144
2012/0280841 A1* 11/2012 Wang .................. H03M 1/1295
                                                      341/110

OTHER PUBLICATIONS

Zhu et al., "A 9-bit 100MS/s Tri-level Charge Redistribution SAR ADC with Asymmetric CDAC Arrray," IEEE, International Symposium on VLSI-DAT, 978(1)1-4, 2012.

Zhu et al., "A 10-bit 100-MS/s Reference-Free SAR ADC in 90 nm CMOS," IEEE, Journal of Solid-State Circuits, 45(6):1111-1121, 2010.

Ginsburg et al., "An Energy-Efficient Charge Recycling Approach for a SAR Converter With Capacitive DAC," IEEE, International Symposium on Circuits and Systems, pp. 184-187, 2005.

* cited by examiner

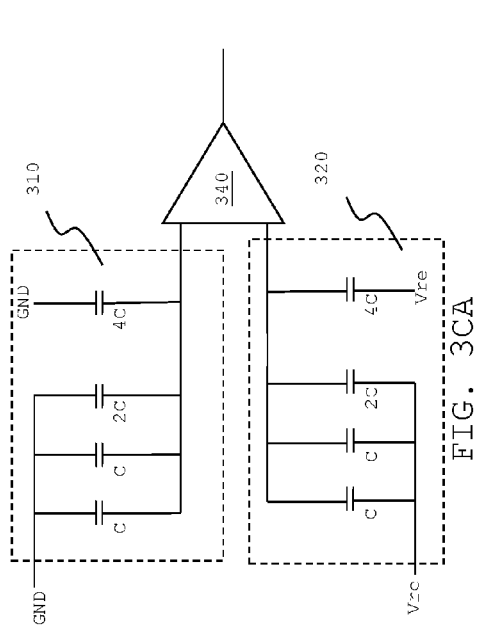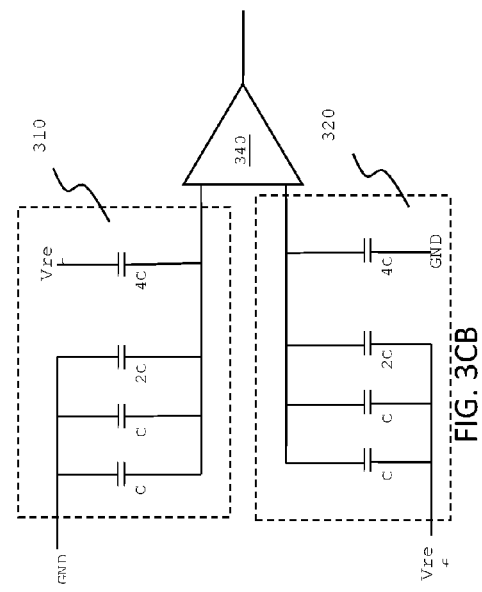
FIG. 3CA
FIG. 3CB

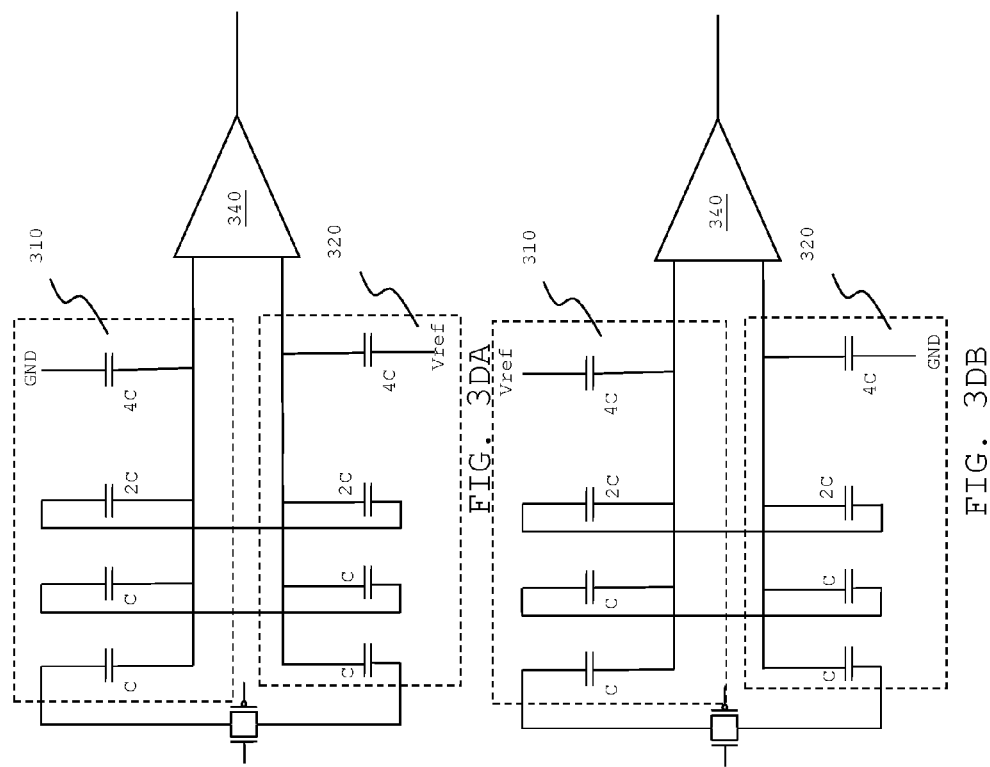

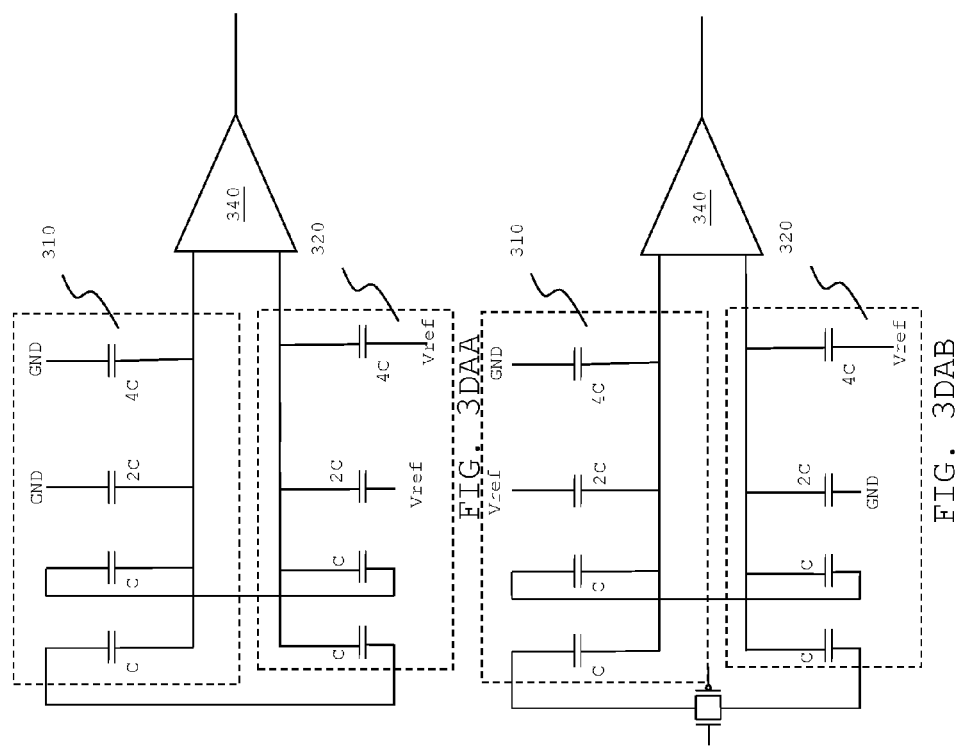

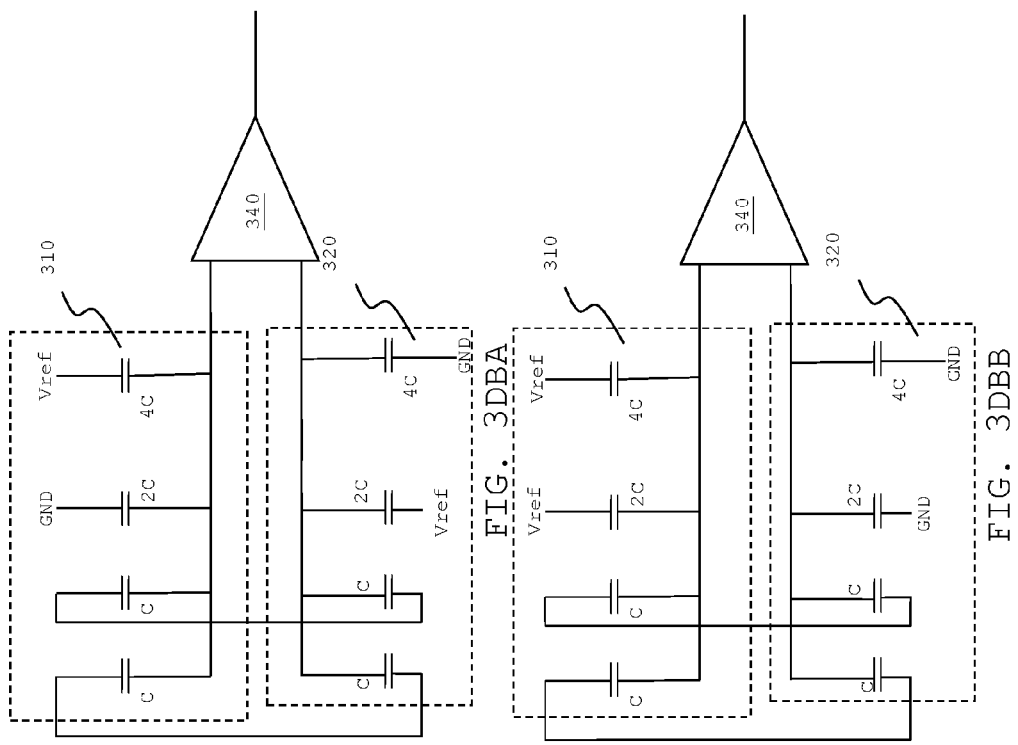

SYMMETRICAL CAPACITOR ARRAYS SUCCESIVE APPROXIMATION REGISTER (SAR) ANALOG-TO-DIGITAL CONVERTER (ADC)

CROSS-REFERENCE TO RELATED APPLICATION

This application claims the benefit of U.S. Provisional Application No. 62/282,395, filed on Jul. 30, 2015, incorporated herein by reference.

BACKGROUND

A successive approximation register (SAR) analog-to-digital converter (ADC) is commonly used for low-power, medium-to-high-resolution applications when sampling rates are below a few mega-samples per second.

Despite SAR ADC devices utilize very little amount of power, a conventional SAR ADC device still exhibit multiple drawbacks. One of the drawbacks is a need to have a large capacitor formed within a digital-to-analog converter (DAC) circuit, which is a component within the SAR ADC device. Furthermore, the area of DAC circuit is generally proportional to the SAR ADC device resolution. Therefore, a fine resolution SAR ADC may have a significantly large in size DAC circuit. This is highly undesirable when the SAR ADC device is implemented on a silicon device.

In addition, conventional switching schemes that are available on conventional SAR ADC devices may not be energy-efficient. Furthermore, most of the switching schemes that are developed for a differential structure are generally not compatible for a single-ended structure.

The conventional single-ended SAR ADC devices may also suffer from problems such as comparator offset, comparator kick-back noise, and need for an additional/external circuit to generate a common mode voltage.

It is within this context that the embodiments described herein arise.

SUMMARY

Embodiments described herein include symmetrical capacitor arrays successive approximation register (SAR) analog-to-digital (ADC) device and a method to operate the SAR ADC device. It should be appreciated that the embodiments can be implemented in numerous ways, such as a process, an apparatus, a system, a device, or a method. Several embodiments are described below.

In one embodiment, analog-to-digital converter (ADC) circuitry includes a first binary-weighted capacitor array having a total capacitance of $2^{n-2}C$. The value of n represents number of bits in a digital signal that represents an analog signal. The ADC circuitry also includes a second binary-weighted capacitor array having a total capacitance of $2^{n-2}C$. In addition to that, the ADC circuitry further includes a comparator circuit having first and second terminals. The first terminal is coupled to the first binary-weighted capacitor array and the second terminal is coupled to the second binary weighted capacitor array. The switching circuit within the second binary-weighted capacitor array may be configurable to couple a largest capacitance capacitor within the second binary-weighted capacitor array from remaining capacitors within the second binary weighted capacitor array.

In another embodiment, a circuitry includes first and second binary-weighted capacitor arrays, a comparator and a switching circuit. Each of these first and second binary-weighted capacitor arrays is having capacitances of $2^{n-2}C$. Furthermore, the first and second binary-weighted capacitor array is designed to be in a symmetrical form. The value of n represents number of bits in a digital signal that may represent a sampled voltage level of an analog signal and the value of C represents a capacitance unit. The comparator circuit includes first and second terminals. The first terminal is coupled to the first binary-weighted capacitor array and the second terminal is coupled to the second binary weighted capacitor array. The switching circuit within the second binary-weighted capacitor array may be configurable to provide a fixed reference voltage level for the remaining capacitors within the second binary-weighted capacitor array.

In an alternative embodiment, a method of operating a successive approximation register (SAR) analog-to-digital converter (ADC) having first and second binary-weighted capacitor arrays, and receiving an input voltage (Vin), a reference voltage level (Vref) and a ground voltage level (GND) includes a step to sample the input voltage of an analog signal on capacitors within the first and second binary-weighted capacitor arrays. The method also includes a step to configure the first and second binary-weighted capacitor arrays to an equivalent single-ended-to-differential converter circuit. The method further includes a step to switch a most significant bit (MSB) capacitor to provide a reference voltage to remaining capacitors in the second binary-weighted capacitor array. In addition to that, the method also includes a step to average out the charges on bottom-plates of capacitors within the first and second binary-weighted capacitor arrays. The method also includes a step to switch symmetrically the first and second binary-weighted capacitor arrays to obtain the remaining bits of the digital signal that represent the input voltage.

Further features of the invention, its nature and various advantages will be more apparent from the accompanying drawings and the following detailed description of the preferred embodiments.

BRIEF DESCRIPTION OF THE DRAWINGS

FIGS. 3A-3DBB shows configuration of a successive approximation register analog-to-digital converter device to generate a 5-bit digital signal based on an input analog signal in accordance with one embodiment.

DETAILED DESCRIPTION

The following embodiments describe symmetrical capacitor arrays successive approximation register (SAR) analog-to-digital converter (ADC) device and a method to operate the SAR ADC device. It will be obvious to one skilled in the art that the present exemplary embodiments may be practiced without some or all of these specific details. In other instances, well-known operations have not been described in detail in order not to unnecessarily obscure the present embodiments.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Unless explicitly stated otherwise, in the description herein any recitation of particular numerical values or value ranges is taken to be a recitation of particular approximate numerical values or approximate value ranges, e.g. +/−20% or +/−10%. For purposes of brevity and clarity, descriptions of embodiments of the present disclosure are limited hereinafter to successive approximation register (SAR) analog-to-digital converter (ADC) and method of operating the SAR ADC, in accordance with the drawings in FIGS. 1 to 5. This, however, does not preclude embodiments of the present disclosure where fundamental principles prevalent among the various embodiments of the present disclosure such as operational, functional or performance characteristics are required.

Figure 1:
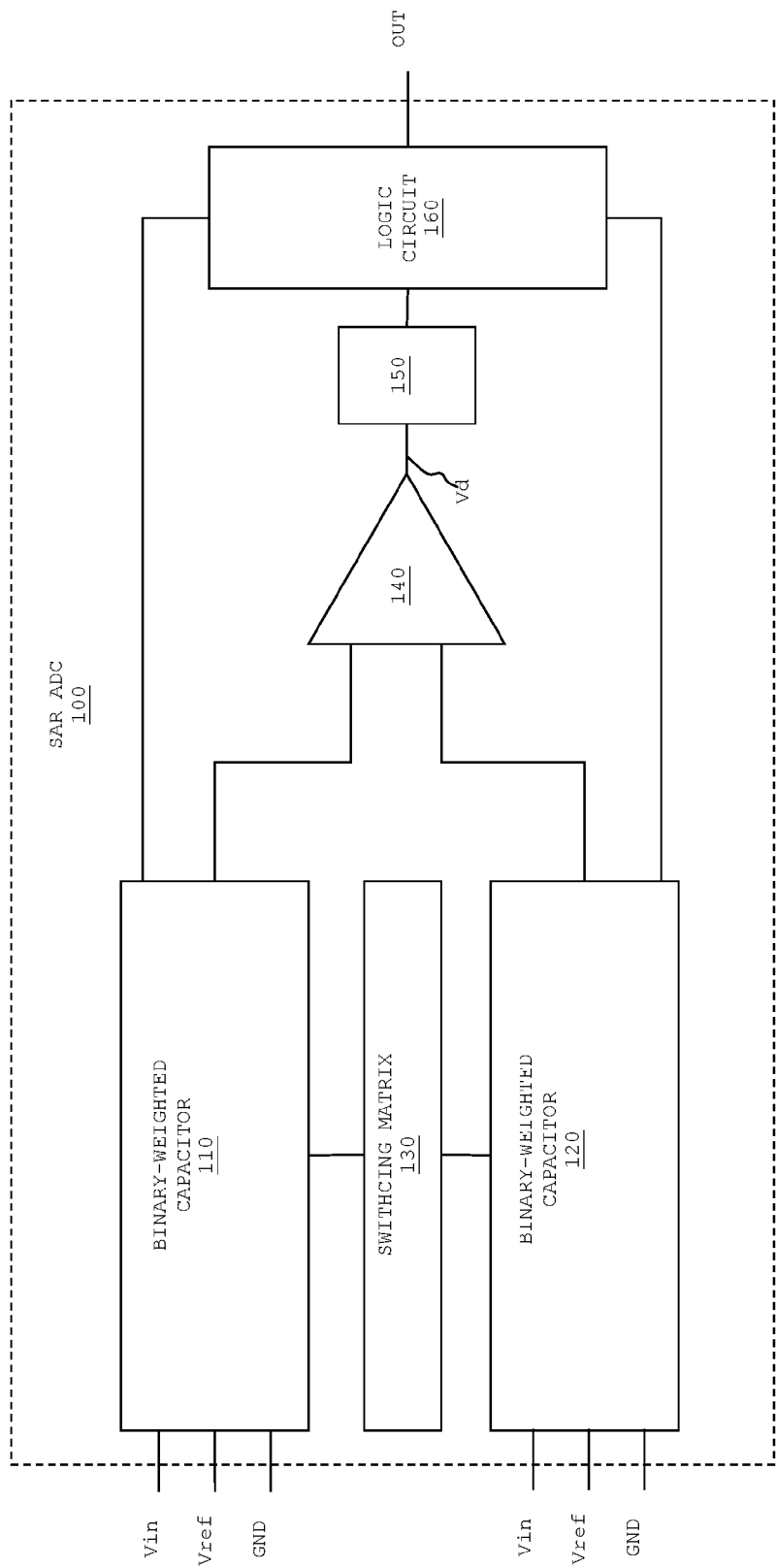
FIG. 1 shows an exemplary successive approximation register (SAR) analog-to-digital converter (ADC) in accordance with one embodiment.

FIG. 1, meant to be illustrative not limiting, illustrates a successive approximation register (SAR) analog-to-digital converter (ADC) in accordance with one embodiment of the present invention. As shown in the embodiment of FIG. 1, SAR ADC 100 includes binary-weighted capacitor arrays 110 and 120, switching matrix 130, comparator 140, clock circuitry 150 and logic circuitry 160.

In one embodiment, SAR ADC 100 may be implemented in a low power apparatus and/or an area efficient apparatus. For example, SAR ADC 100 may form part of a prosthesis device. In such embodiment, SAR ADC 100 within the prosthesis device may convert a bioelectric signal, which can be defined as any electrical signal originating from biological organisms, to a digital signal. It should be appreciated that the bioelectric signal may be processed using SAR ADC 100 and other components in a bioelectric signal acquisition chain (e.g., multi-channel bioelectric amplifiers and analog multiplexers). A prosthesis having SAR ADC 100 may be inserted into human anatomy through a surgical procedure, in one embodiment.

In another example, SAR ADC 100 may form part of a device that can be used for music recording, digital signal processing and/or scientific instrument measuring. In such examples, SAR ADC 100 may form part of or may be utilized together with one or more microcontrollers and/or digital signal processors.

In one embodiment, SAR ADC 100 receives a sampled voltage level (i.e., Vin) of an analog signal and generates an output signal (i.e., an OUT signal). The Vin indicates a voltage level of an analog signal (e.g., a neural signal) at a particular instance. The output signal is a digital signal that represents that particular voltage level Vin in a digital form.

It should be appreciated that an analog signal is a continuous signal for which time varying feature (i.e., a variable) of the signal is a representation of some other time varying quantity, i.e., analogous to another time varying signal. A digital signal on the other hand is an electrical signal that can be defined by a pattern of bits (e.g., 11001). The digital signal may be propagated as a square waveform whereby a high voltage level in the square waveform represents a bit '1' whereas a low voltage level in the square waveform represents a bit '0'.

As shown in the embodiment of FIG. 1, the Vin voltage level is inputted in to binary-weighted capacitor arrays 110 and 120. Using a successive approximating technique in binary-weighted capacitor arrays 110 and 120, SAR ADC 100 may generate the OUT signal. The OUT signal is in binary form. In one exemplary embodiment, the OUT signal may include a 10-bit binary sequence. The OUT signal represents a particular voltage level Vin, which is a voltage level at the sampled instance of the analog signal. In one embodiment, the conversion of Vin voltage level to the digital signal may take at least five clock cycles. Therefore, if the operating frequency of SAR ADC 100 is 50 kilohertz (kHz), then each clock cycle may have a period of 0.02 milliseconds (ms), and process of converting the Vin to the OUT signal may take 0.1 ms.

As stated above, the Vin voltage level represents a particular voltage level at a particular sampled instance of an analog signal. In one exemplary embodiment, the Vin is a voltage level of the bioelectric signal at a particular sampled instance. Generally, the voltage level of the Vin may approximately be 1 Volt (V) or less. The Vin voltage levels may be captured from an analog signal at 100 kilosample/second (KS/s).

SAR ADC 100 may be formed within a silicon device. In one embodiment, SAR ADC 100 may be formed on a silicon device, which could be formed using 0.18 micrometer (μm) complementary metal oxide semiconductor (CMOS) technology. Alternatively, SAR ADC 100 may be formed using other semiconductor processes compared to 0.18 μm CMOS technology (e.g., 90 nanometers (nm), 65 nm, and etc.).

Referring still to FIG. 1, SAR ADC 100 includes two binary-switched capacitor arrays 110 and 120 and a switching matrix 130. Collectively, these circuitries may be referred to as a digital-to-analog converter (DAC) circuit. This is because the DAC circuit may receive a digital signal (as a control signal) from logic circuitry 160 to control the voltage levels (i.e., an analog signal voltage level) at different input terminals of comparator 140.

Furthermore, binary-switched capacitor arrays 110 and 120 are substantially identical to each other. Therefore, in one embodiment, the DAC circuit may also be referred to as a symmetrical DAC circuit (i.e., symmetrical across the two terminals of comparator 140). The symmetrical nature of the DAC circuit enables a symmetrical switching technique of a DAC circuit.

In one embodiment, binary-switched capacitor arrays 110 or 120 may also be referred to as a digital-to-analog converter positive (DACP) circuit or a digital-to-analog converter negative (DACN) circuit. In one embodiment, binary-switched capacitor array 110 that is coupled to a positive terminal of comparator 140 may be referred to as the DACP circuit whereas binary-switched capacitor array 120 that is coupled to a negative terminal of comparator 140 may be referred to as the DACN circuit.

Binary-switched capacitor arrays 110 and 120 may include multiple capacitors (not shown in FIG. 1). Total capacitances for binary-switched capacitor array 110 may be $2^{n-2}C$. Similarly, total capacitances for binary-switched capacitor array 120 may also be $2^{n-2}C$. The value of n represents number of bits in a digital signal and the value of C represents a capacitance unit.

In one embodiment, the value of n may be any integer value that could be greater than 0. Hence, a 10-bit digital signal may have total capacitances of $2^8 C$ on each of the binary-switched capacitor arrays 110 and 120. In one exemplary embodiment, the value of C may be approximately 34 femto Farad (fF). Hence, each binary-switched capacitor array 110 or 120 may have total capacitances of 8.7 pico Farad (pF), and the entire DAC may have total capacitances of 18 pF (i.e., $2^9 C$).

Furthermore, the capacitors in each of these binary-switched capacitor arrays 110 and 120 may be electrically parallel to one another. In one embodiment, the capacitance values for each capacitor within these binary-switched capacitor arrays 110 and 120 varies based on a sequence that follows $2^{n-m}C$, whereby the value of n represents number of bits within a digital signal, a value of C represents the capacitance unit, and a value of m represents an integer value that decreases from the value of n to a value of 3 as the capacitor reaches nearer to the input terminals of comparator 140.

For example, in SAR ADC 100 that converts a voltage level of an analog signal to a 10-bit digital signal, the capacitors within binary-switched capacitor arrays 110 and 120 that are closest to the input terminals of comparator 140 may have capacitances of approximately $2^8 C$. Furthermore, the capacitors within binary-switched capacitor arrays 110 and 120 that are second closest to the input terminals of comparator 140 may have capacitances of approximately $2^7 C$. And this follows till the furthest capacitor in binary-switched capacitor arrays 110 and 120 from the input terminals of comparator 140 may have capacitances of C. In addition to that, there may also be additional capacitors within binary-switched capacitor arrays 110 and 120 that are located furthest away from the input terminals of comparator 140 having the capacitances of C.

Binary-switched capacitor arrays 110 and 120 may also include multiple switches (not shown in FIG. 1). These switches may be utilized to control whether to supply a reference voltage (Vref) to the capacitors, a ground voltage level (GND) to the capacitors or to couple top/bottom-plates of the capacitors within binary-switched capacitors 110 and 120. These switches are controlled by logic circuitry 160.

In addition, one of the binary-switched capacitor arrays 110 or 120 may further include an additional switch (not shown in FIG. 1) that is capable of isolating a capacitor having largest capacitances from remaining capacitors in that particular binary-switched capacitor array 110 or 120. In one embodiment, binary-switched capacitor array 110 or 120 that is coupled to a negative terminal of comparator 140 may have such additional switch. The switch enables sampling of the largest capacitor at a different voltage level relative to rest of the capacitors within that binary-switched capacitor array.

As shown in the embodiment of FIG. 1, switching matrix 130 may be formed between binary-switched capacitor arrays 110 and 120. Switching matrix 130 may include multiple switches (and these are in addition to the switches mentioned in binary-switched capacitor arrays 110 and 120). These switches, when activated, may couple top-plates of the capacitors in one array to bottom-plates of capacitors in another array. The switches are also controlled by logic circuitry 160.

The control signal provided by logic circuitry 160 may be in the digital form. These control signals controlling these switches within binary-weighted capacitor arrays 110 and 120 and switching matrix 130 may generate an appropriate voltage level across input terminals of comparator 140. Hence, this is the reason why the binary-weighted capacitor arrays 110 and 120 and switching matrix 130 collectively is referred to as the DAC circuit.

In one embodiment, the control signal controlling these switches may generate different voltage level differences across the positive and negative terminals of comparator 140. For example, the control signal may generate different voltage level differences across the positive and negative terminals of 2Vin−Vref, 2Vin−3Vref/2, 2Vin−Vref/2, 2Vin−7Vref/4, 2Vin−5Vref/4, 2Vin−3Verf/4 or 2Vin −Vref/4.

A person skilled in the art appreciates that a switch generally refers to an electrical component that connects two electrical connections or terminates a connection between the two electrical connections. For example, when the switch is open, the electrical connections between two points are terminated. Alternatively, when the switch is close, the electrical connections between two points are connected. In one embodiment, each switch may include using one or more transistors, one or more capacitors or one or more resistors.

Still referring to FIG. 1, binary-switched capacitor arrays 110 and 120 are coupled to the input terminals of comparator 140. In one embodiment, one of the input terminals is a positive input terminal and another of the input terminals is a negative input terminal. For example, binary-switched capacitor array 110 may be coupled to the positive input terminal of comparator 140 and binary-switched capacitor array 120 may be coupled to the negative input terminal of comparator 140.

Comparator 140 compares a voltage supplied at its input terminal and generates a voltage level Vd. In one embodiment, the difference between the voltage levels at the input terminals of comparator 140 may be 2Vin−Vref, 2Vin−3/2Vref, 2Vin−Vref/2, 2Vin−7Vref/4, 2Vin−5Vref/4, 2Vin−3Vref/4, or 2Vin−Vref/4. When the any one of the above-mentioned voltage level differences is greater than 0 V, the digital signal will include a bit 1 to represent the input voltage level Vin. Alternatively, when the any of the above-mentioned voltage level differences is less than or equal to 0 V, the digital signal will include a bit 0 to represent the input voltage level Vin.

Comparator 140 may be a high gain amplifier. In one embodiment, comparator 140 may be a dynamic comparator, which is based on a clock signal. It should be appreciated that the dynamic comparator may also help to reduce consumption associated with SAR ADC 100.

As shown in the embodiment of FIG. 1, comparator 140 is coupled to clock circuitry 150. Clock circuitry 150 may receive the Vd signal and merely outputs the Vd signal to logic circuitry 160. In addition to that, clock circuitry 150 may also control sampling of an analog signal to generate a sampled input voltage Vin. Furthermore, clock circuitry 150 may also control logic circuitry 160 to change from one phase to another phase of generating a digital signal from an analog signal.

The Vd signal is then supplied to logic circuitry 160. Logic circuitry 160 controls binary-weighted capacitor array 110 and 120 and switching matrix 130. The control is performed in order to switch the DAC circuit from one phase to another phase. In one embodiment, the control signal may vary depending on determination of each bit of a digital signal that represents the Vin voltage level. At the end, and based on the various control signals to switch the DAC circuit from one phase to another phase, an output signal (i.e., OUT signal) that represents an input voltage Vin may be generated.

Figure 2:
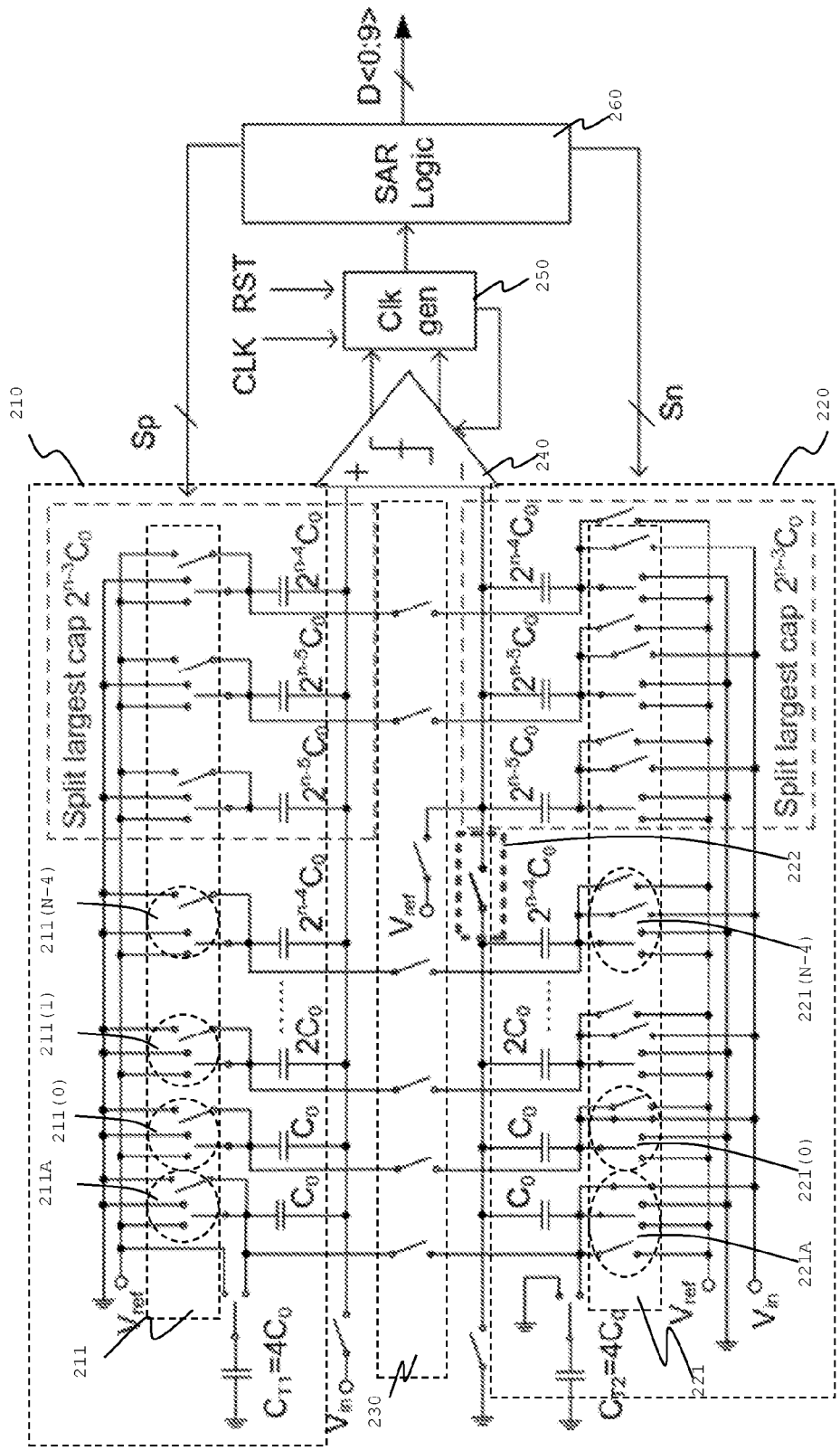
FIG. 2 shows a detailed implementation successive approximation register analog-to-digital converter device in accordance with one embodiment.

FIG. 2, meant to be illustrative and not limiting, illustrates a detailed implementation of an SAR ADC device in accordance with one embodiment of the present invention. In one embodiment, SAR ADC device 200 may be similar to SAR ADC 100 of FIG. 1. SAR ADC 200 includes two binary-weighted capacitor arrays 210 and 220, switching matrix 230, comparator 240, clock circuitry 250 and logic circuitry 260 that may be similar to two binary-weighted capacitor arrays 110 and 120, switching matrix 130, comparator 140, clock circuitry 150 and logic circuitry 160, respectively, of FIG. 1, in one embodiment. Therefore, for the sake of brevity, the details of these components will not be repeated in here again.

As stated in SAR ADC of FIG. 1, binary-weighted capacitor arrays 210 and 220 includes multiple capacitors. Capacitances of these capacitors are based on a following sequence of $2^{n-m}C$, whereby the value of m decreases from value of n to 3 progressively as one moves towards input terminals of comparator 240. For example, the capacitor on the far left of binary-weighted capacitor array 210 or 220 (relative to FIG. 2) is having a capacitance value of Co whereas the capacitor on the far right of each binary-weighted capacitor array 210 or 220 is having a capacitance value of $2^{n-3}$Co. In addition, there is an additional capacitor on the far left of each binary-weighted capacitor arrays 210 and 220 having a capacitance of Co. As shown in the embodiment of FIG. 2, and also as described under FIG. 1, these capacitors within binary-weighted capacitor arrays 210 and 220 are arranged electrically parallel to one another.

Furthermore, as stated under binary-weighted capacitor arrays 110 and 120 of FIG. 1, binary-weighted capacitor arrays 210 and 220 may also include multiple switches. In binary-weighted capacitor array 210, switches 211A, 211(0)-211(n-4) and 211(n-3) controls whether to supply a reference voltage Vref to their respective capacitor, a ground voltage level GND to their respective capacitor or electrically couple top-plates of their respective capacitor that are coupled to switches 211A, 211(0)-211(n-4) and 211(n-3) to bottom-plates of corresponding capacitors in binary-weighted capacitor array 220. Similarly, in binary-weighted capacitor array 220, switches 221A, 221(0)-221(n-4) and 221(n-3) controls whether to supply the reference voltage Vref to their respective capacitors, the ground voltage level GND to their respective capacitors or to couple the bottom-plates of their respective capacitor that are coupled to the switches 221A, 212(0)-221(n-4) and 221(n-3) to the corresponding top-plates of the capacitors in binary-weighted capacitor array 210.

Still referring to FIG. 2, a capacitor having large capacitance may be split into multiple capacitors having a smaller capacitance. For example, in the embodiment of FIG. 2, the capacitor having capacitances of $2^{n-3}$Co is split into three capacitors with each having capacitances of $2^{n-5}$Co, $2^{n-5}$Co and $2^{n-4}$Co. It should be appreciated that arranging these three capacitors having capacitance values of $2^{n-5}$Co, $2^{n-5}$Co and $2^{n-4}$Co in parallel may sum up to capacitances of $2^{n-3}$Co. Furthermore, a size needed to form these three capacitors having capacitance values of $2^{n-5}$Co, $2^{n-5}$Co and $2^{n-4}$Co may be smaller than a size needed to form one capacitor having capacitances of $2^{n-3}$Co.

In one embodiment, the capacitor having a capacitance larger than predetermined capacitances may be split into multiple capacitors with smaller capacitances. In one exemplary embodiment, the predetermined capacitances may be 9 pF.

Binary-switched capacitor array 220 may also include an additional switch 222. Switch 222 may be utilized to isolate remaining capacitors within binary switched capacitor array 220 from a largest capacitance capacitor (e.g., $2^{n-3}$Co capacitor). The largest capacitances capacitor may also be referred to as a most significant bit (MSB) capacitor. Such isolation may help binary-switched capacitor array 220 to sample at different voltage levels. Hence, switch 222 may be open (i.e., electrically disconnected) when binary-switched capacitor array 210 and 220 are in a sampling phase. However, at subsequent phases, the switch 222 is close (i.e., electrically connected).

In addition, switching matrix 230 may be similar to switching matrix 130 of FIG. 1. Switching matrix 230 includes a plurality of switches whereby each switch may couple a top-plate of a capacitor within binary-weighted capacitor array 210 to a bottom-plate of a capacitor within binary-weighted capacitor array 220. In one embodiment, these switches may be close (i.e., establishing connection) when performing a bottom-plate charge-averaging phase and normal symmetrical switching phase for the DAC.

Referring still to FIG. 2, binary-switched capacitor arrays 210 and 220 are coupled to comparator 240. In one embodiment, binary-switched capacitor array 210 is coupled to a positive terminal of comparator 240 (and therefore may be referred to as the DACP circuit) and binary-switched capacitor array 220 is coupled to a negative terminal of comparator 240 (and therefore may be referred to as the DACN circuit).

Furthermore, the binary-switched capacitor arrays 210 and 220 and switching matrix 230 may be controlled to go through five different phases. These five different phases will be explained in detail using a conversion of a voltage level at a sampled instance of an analog signal to a 5-bit digital signal conversion as illustrated in FIGS. 3A-3DBB.

The embodiment of FIG. 2 also includes a capacitor having capacitance CT1 in binary-switched capacitor array 210 and a capacitor having capacitance CT2 in binary-switched capacitor array 220. In one exemplary embodiment, the capacitances CT1 and CT2 may be 4Co when the digital signal is a 10-bit digital signal. The capacitors CT1 and CT2 may be utilized to obtain least significant bit.

Figure 3A:
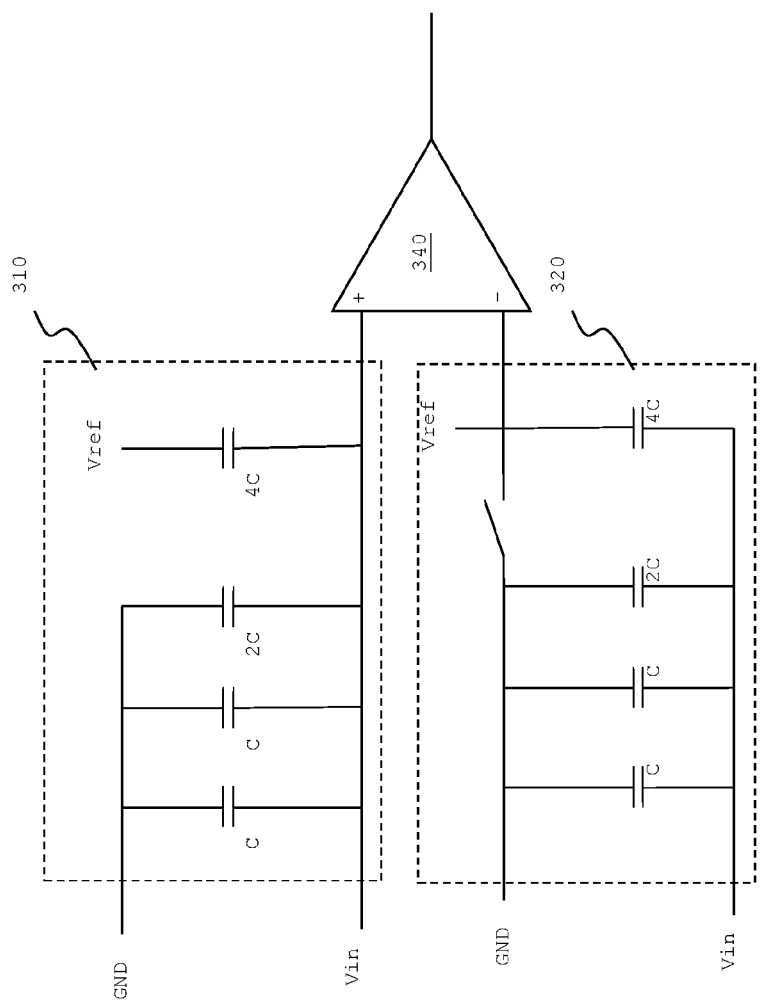
Figure 3B:
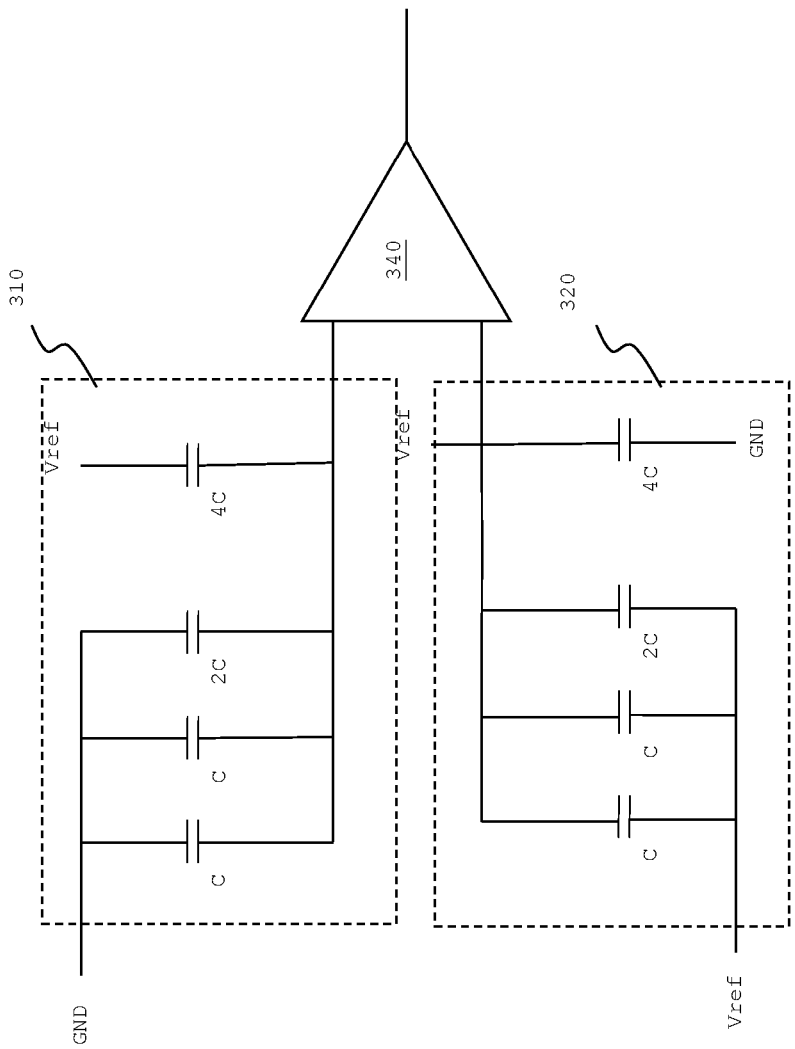

FIGS. 3A-3DBB, meant to be illustrative and not limiting, illustrate operations of a SAR ADC device to generate a 5-bit digital signal in accordance with one embodiment of the present invention. The SAR ADC utilized in FIGS. 3A-3DBB may be similar to SAR ADC 200 of FIG. 2 except that in these embodiments, SAR ADC 200 may be adapted to generate a 5-bit digital signal. Hence, each weighted-binary capacitor array in the SAR ADC device in FIGS. 3A-3DBB may only include corresponding capacitors having the capacitance of C, C, 2C and 4C. Each of FIGS. 3A-3DBB shows the manner in which the DAC circuit is configured across various phases in order to obtain the 5-bit digital signal. For example, embodiment of FIG. 3A shows the DAC circuit is configured for a sampling phase. Embodiment of FIG. 3B shows the DAC circuit is configured for an inversion phase. Embodiments of FIGS. 3CA and 3CB shows the DAC circuit is configured for most significant bit(MSB)-cap advance switching phase. Embodiments of FIGS. 3DA and 3DB shows the DAC circuit is configured for a bottom-plate charge averaging phase. Finally, embodiments of FIGS. 3DAA-3DBB shows the DAC circuit configured for a normal symmetrical switching phase. In one embodiment, each of these phases (i.e., the sampling, the inversion, the MSB-cap advance switching, the bottom-plate charge averaging and the normal symmetrical phases) require at least one clock cycle. Hence, these five phases of DAC circuit may be performed using 5 clock cycles.

FIG. 3A shows SAR ADC device configured for a sampling phase in order to generate a 5-bit digital signal from an analog signal. In reference to binary-weighted capacitor arrays 310 and 320, top-plates and bottom-plates of C, C and 2C capacitors are coupled to receive a ground voltage level and Vin voltage level, respectively. The top and bottom-plates of 4C capacitors are coupled to receive a Vref voltage level and the Vin voltage level, respectively. These capacitors may be coupled to receive these respective voltage levels by configuring the switches (e.g., switches 211, switches 221 and switching matrix 230 of FIG. 2). Such configuration information may be obtained from a control signal from logic circuitry (e.g., logic circuitry 160 of FIG. 1 or logic circuitry 260 of FIG. 2).

The configuration as shown in FIG. 3A is referred to as a sampling phase because the charges are sampled at the bottom and top-plates of binary-weighted capacitor arrays 310 and 320 when the Vin is applied these plate. In one embodiment, the stored charges into these capacitors are in an opposite polarity. Therefore, the total charges stored in binary-weighted capacitor array 310 is 4C(Vin−Vref/2) and the total charges stored in the binary-weighted capacitor array 320 is 4C(Vref/2−Vin). However, the summation of these electrical charges stored within the DAC circuit is zero as a result of opposite polarity.

FIG. 3B shows an inversion phase of the SAR ADC device. In reference to binary-weighted capacitor array 310, the top and bottom-plates of C, C and 2C capacitors are coupled to the ground voltage terminal (that supplies a ground voltage level) and a positive input terminal of comparator 340, respectively. The top and bottom-plates of 4C capacitors are coupled to a reference voltage level terminal (terminal that supplies the Vref voltage level) and the positive input terminal of comparator 340, respectively. In reference to binary-weighted capacitor array 320, the bottom and top-plates of C, C and 2C capacitors are coupled to the Vref voltage level terminal and the negative input terminal of comparator 340, respectively. The bottom and top-plates of 4C capacitors are coupled to the ground voltage level terminal and the negative input terminal of comparator 340, respectively.

The inversion phase as shown in FIG. 3B generates Vin on the positive input terminal of comparator 340 and generates Vref−Vin on the negative input terminal of comparator 340. As a result of these voltage levels across input terminals of comparator 340, the configuration of FIG. 3B (i.e., embodiments configured to be in the inversion phase) may also be referred to as passive single-ended-to differential conversions.

Comparator 340 generates an output voltage that reflects differences between the voltages supplied at its input terminals. Hence, a voltage difference between the two input terminals is 2Vin−Vref. When the 2Vin−Vref is greater than the value of 0 Volt, the digital signal that represents the voltage level of Vin at a particular instance of an analog signal is having a most significant bit value of 1. Alternatively, when the 2Vin−Vref is less than the value of 0, then the digital signal of the Vin voltage level at a particular instance of the analog signal is having a most significant bit value of 0.

Similar to FIG. 3A, these capacitors may be coupled to receive these respective voltage levels by configuring the switches (e.g., switches 211, switches 221 and switching matrix 230 of FIG. 2). Such configuration information may be obtained from logic circuitry (e.g., logic circuitry 160 of FIG. 1 or logic circuitry 260 of FIG. 2).

FIG. 3CA shows MSB-cap advance switching phase for the DAC circuit when the most significant bit of the digital signal was determined to be a 1 in accordance to one embodiment of the present invention.

In reference to binary-weighted capacitor array 310, the top and bottom-plates of C, C and 2C capacitors are coupled to the ground voltage level terminal and the positive input terminal of comparator 340, respectively. The top and bottom-plates of the 4C capacitors are coupled to the ground voltage level terminal and the positive input terminals of comparator 340, respectively. In reference to binary-weighted capacitor arrays 320, the bottom and top-plates of C, C and 2C capacitors are coupled to the reference voltage level terminal and the negative input terminal of comparator 340, respectively. The bottom and top-plates of 4C capacitors are coupled to the reference voltage level terminal and the negative input terminals of comparator 340, respectively.

The MSB-cap advance switching phase as shown in FIG. 3CA generates a voltage level of Vin−Vref/2 on the positive input terminal of comparator 340 and 3Vref/2−Vin on the negative input terminal of comparator 340. Comparator 340 may generate an output voltage that reflects the differences between the voltages supplied at the positive and negative input terminals. Hence, the voltage differences remain the same as the inversion phase, i.e., 2Vin−Vref, although the voltage level on the input terminals has changed.

FIG. 3CB shows a MSB-cap advance switching phase for a DAC circuit when the most significant bit of the digital signal was determined to be a 0 in accordance to one embodiment of the present invention.

In reference to binary-weighted capacitor arrays 310 and 320, the top and bottom-plates of C, C, 2C and 4C capacitors are coupled in a similar manner as to the capacitors C, C, 2C and 4C of binary-weighted capacitor arrays 310 and 320 of FIG. 3B.

Hence, the MSB-cap advance switching phase as shown in FIG. 3CB may have identical voltage differences across the input terminals of comparator 340, i.e., 2Vin−Vref, although the voltage levels on the input terminals may have changed.

The configurations shown in FIGS. 3CA and 3CB is referred as the MSB-cap advance switching phase because in both of these configurations, the MSB capacitor (i.e., the capacitor having capacitances of 4C) are switched to opposite voltage levels and will not undergo bottom-plate charge-averaging phase. The reason for switching the MSB capacitors in advance is that the MSB capacitors provide a reference voltage level to the entire binary-weighted capacitor array 320. Such reference voltage may affix the bottom-plate voltage levels to Vref/2 voltage level.

It should be appreciated that by not affixing the bottom-plate voltage levels to the Vref/2 voltage level may cause the bottom-plate voltage levels to float and perhaps drift. In such situation, the voltage levels on the bottom-plate of the capacitors may then be defined by the impedances of capacitors. Hence, the bottom-plate voltage levels may drift away from a required voltage level of Vref/2 (e.g., to a voltage level above Vdd or below ground), which may cause unnecessary leakages or distortion within the SAR ADC device.

FIG. 3DA shows a DAC circuit configured for a bottom-plate charge-averaging phase when the most significant bit of the digital signal was determined to be a 1 in accordance to one embodiment of the present invention. In one embodiment, this phase occurs immediately after the MSB-cap advance switching phase for the DAC circuit.

In this phase, the top-plate of the capacitor C that is located at the left most position within binary weighted capacitor array 310 and the bottom-plate of the capacitor C that is located at the left most position within binary-weighted capacitor array 320 are coupled to a pass gate transistor. Furthermore, the top-plates of other capacitors having capacitances of C and 2C within binary-weighted capacitor array 310 are coupled to the bottom-plates of other capacitors having capacitances of C and 2C within binary-weighted capacitor array 320, respectively. The top and bottom-plates of capacitor 4C of binary-weighted capacitor array 310 may be coupled to the ground voltage level terminal and the positive input terminal of comparator 340, respectively. The bottom and top-plates of capacitor 4C of binary-weighted capacitor array 320 may be coupled to the reference voltage level terminal and the negative input terminal of comparator 340, respectively.

The bottom-plate charge-averaging phase as shown in FIG. 3DA generates Vin−Vref/2+Vref/4 on the positive input terminal of comparator 340 and generates 3Vref/2−Vref/4−Vin on the negative input terminal of comparator 340.

FIG. 3DB shows the DAC circuit configured to be in bottom-plate charge-averaging phase when the most significant bit of the digital signal was determined to be a 0 in accordance to one embodiment of the present invention. Similar to FIG. 3DA, this phase occurs immediately after the MSB-cap advance switching phase for the DAC circuit, in one embodiment.

In this phase, the top and bottom-plates of capacitor are coupled in a similar manner as to FIG. 3DA except for the most significant bit capacitor (i.e., the capacitor with the capacitances of 4C). The capacitor with the capacitances of 4C on binary-weighted capacitor array 310 has its top-plate coupled to Vref voltage terminal and its bottom-plate coupled to the positive input terminal of comparator 340. In addition to that, the capacitor with capacitances of 4C on binary-weighted capacitor array 320 has its top-plate coupled to the negative terminal of comparator 340 and its bottom-plate coupled to the ground voltage level terminal.

FIGS. 3DA and 3DB are utilized for the purpose of charge-averaging on the bottom-plates of the capacitors. The charge-averaging phase may help to ascertain whether the second most significant bit is either 1 or 0. For example, in the configuration as shown in FIGS. 3DA and 3DB, whereby if the voltage differences (e.g., 2Vin−3Vref/2 for FIG. 3DA or 2Vin−Vref/2 for FIG. 3DB) between the input terminals of comparator 340 is greater than 0, then the second MSB of the digital signal is 1. Alternatively, still in reference to the configurations of FIGS. 3DA and 3DB, whereby if the voltage differences between the input terminals at comparator 340 is 0 or less, then the second MSB of the digital signal is 0.

Hence, by end of this phase, at least 2 bits of the digital signal that may represent the Vin voltage level of the sampled analog signal is obtained. For example, using the configuration of FIG. 3DA, the representative digital signal may be 11XXX or 10XXX, whereby the value of X represents yet-to-be-determined bits. Alternatively, using the configuration of FIG. 3DB, the representative digital signal may be 01XXX or 00XXX, whereby X represents yet-to-be-determined bits.

FIG. 3DAA shows the DAC circuit that is configured to a normal symmetrical switching phase when the MSB and the second most MSB of the digital signal have been determined to be one in accordance to one embodiment of the present invention.

In this phase, the capacitors having capacitance C, C and 4C are coupled to similar voltage levels as shown in FIG. 3DA. However, the top and bottom-plates of capacitor having capacitance 2C of binary-switched capacitor array 310 are coupled to the ground voltage level terminal and the positive input terminal of comparator, respectively. Furthermore, the bottom and top-plates of capacitors having capacitances of 2C in binary-switched capacitor array 320 are coupled to the reference voltage level and the negative input terminal of comparator 340, respectively.

FIG. 3DBA shows the DAC circuit configured to a normal symmetrical switching phase when the MSB and the second most MSB of the digital signal have been determined to be zero and one, respectively, in accordance to one embodiment of the present invention.

In this phase, the capacitors having capacitances C, C and 4C are coupled to similar voltage levels as shown in FIG. 3DB. However, the top and bottom-plates of the capacitors having capacitances 2C of binary-switched capacitor array 310 are coupled to the ground voltage level terminal and the positive input terminal of comparator, respectively. Furthermore, the bottom and top-plates of the capacitor having capacitances 2C of binary-switched capacitor array 320 are coupled to the reference voltage level terminal and the negative input terminal of comparator 340, respectively.

FIG. 3DBB shows the DAC circuit configured to a normal symmetrical switching phase when the MSB and the second most MSB of the digital signal have been determined to be a zero and zero, respectively, in accordance to one embodiment of the present invention.

In this phase, the capacitors having capacitances of C, C and 4C are coupled to similar voltage levels as shown in FIG. 3DB. However, the top and bottom-plates of the capacitor having capacitances 2C of binary-switched capacitor array 310 are coupled to the reference voltage level terminal and the positive input terminal of comparator, respectively. Furthermore, the bottom and top-plates of the capacitor having capacitances of 2C of binary-switched capacitor array 320 are coupled to the ground voltage level terminal and the negative input terminal of comparator 340, respectively.

The configuration shown in FIGS. 3DAA-3DBB determines the $3^{rd}$ bit of the digital signal. For example, if the voltage level across the positive and negative input terminals (e.g., 2Vin−7Vref/4 for FIG. 3DAA, 2Vin−5Vref/4 for FIG. 3DAB, 2Vin−3Vref/4 for FIG. 3DBB or 2Vin−Vref/4 for FIG. 3DBB) is greater than 0, then the $3^{rd}$ bit is determined to be 1. Alternatively, if the voltage across the positive and negative input terminals is less than or equal to 0, then the $3^{rd}$ bit is determined to be 0.

The determination of the 4th bit and 5th bit of the digital signal may also be performed by coupling the remaining capacitors in the array (e.g., capacitors with capacitances C) in similar manner in which the capacitor with capacitances 2C may be coupled. For example, in a subsequent configuration after the configuration as shown in the FIG. 3DAA, the top and bottom-plates of the capacitor having capacitance of C and in binary-weighted capacitor array 310 are coupled to the ground voltage level terminal and the positive input terminal of comparator 340. Furthermore, the top and bottom-plates of the capacitor having capacitance of C and in binary-weighted capacitor array 320 are coupled to the negative input terminal of comparator 340 and the reference voltage level terminal. Based on this configuration, the 4th bit of the digital signal may be determined by comparing the voltage differences between input terminals across comparator 340.

Figure 4:
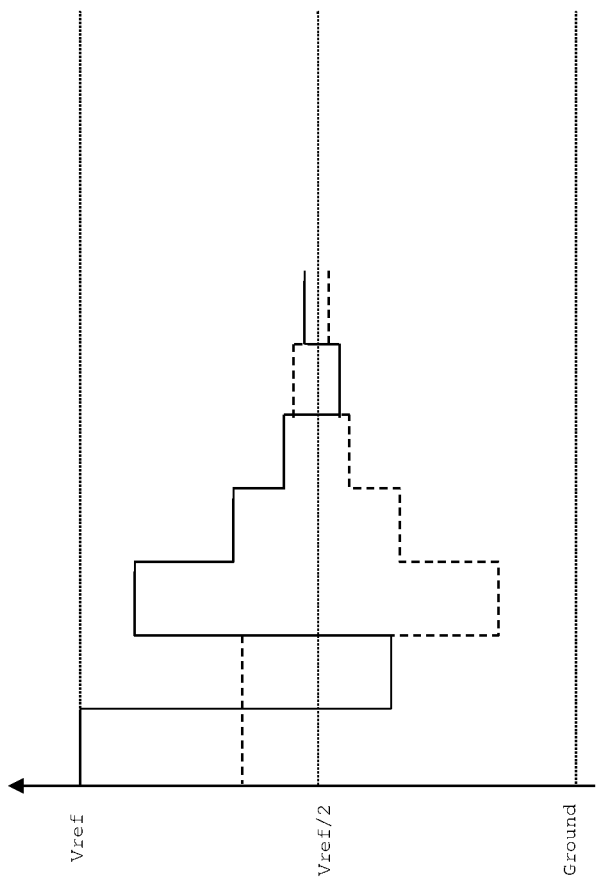
FIG. 4 shows exemplary waveforms at input terminals of comparator in accordance with one embodiment.

FIG. 4, meant to be illustrative and not limiting, illustrates waveforms at input terminals of comparator in accordance with one embodiment of the present invention. The comparator may be similar to comparator 140 of FIG. 1, comparator 240 of FIG. 2 or comparator 340 of FIGS. 3A-3DBB. The solid line waveform refers to the voltage levels at the negative terminal of the comparator and the dotted line waveform refers to the voltage levels at the positive terminal of the comparator. As a result of symmetrical design of the DAC, due to the symmetrical design of the two binary-weighted capacitor arrays, the voltage waveforms are also symmetrical.

Furthermore, the voltage differences between input terminals at the comparator are also large. In one embodiment, the voltage differences may be based on 2Vin references rather than just Vin reference alone. Basing from the 2Vin references may significantly reduce the signal-to-noise ratio (SNR) of the SAR ADC device.

Furthermore, the symmetrical nature of voltage levels across the input terminals of comparator may completely remove any offset that may be triggered by a comparator (e.g., comparator 140 of FIG. 1, comparator 240 of FIG. 2 or comparator 340 of FIGS. 3A-3DBB).

Figure 5:
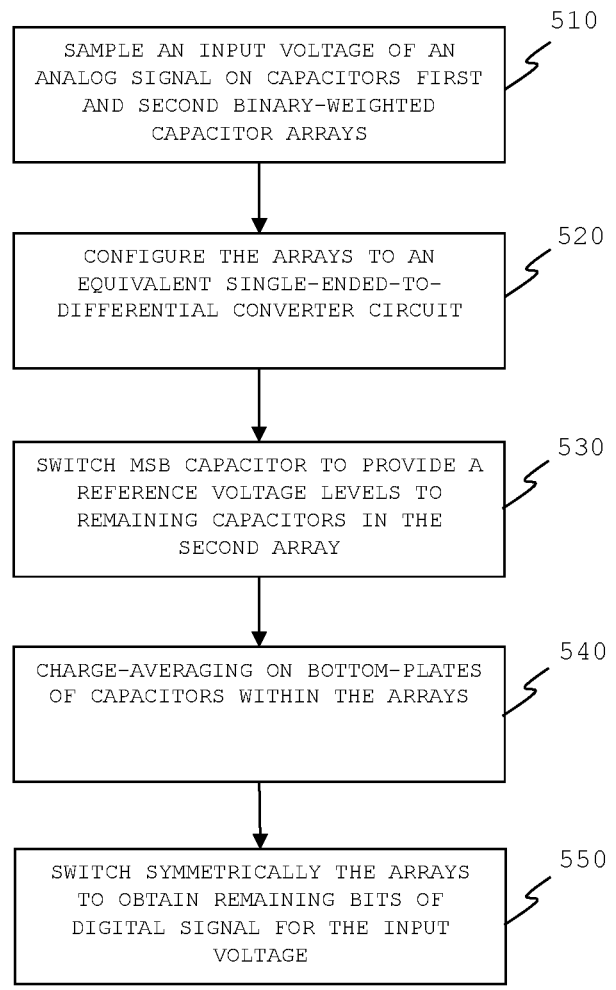
FIG. 5 shows a flowchart of an illustrative method of operating a successive approximation register (SAR) analog-to-digital converter (ADC) in accordance with one embodiment.

FIG. 5, meant to be illustrative and not limiting, illustrates a flowchart for a method of operating a successive approximation register (SAR) analog-to-digital converter (ADC). In one embodiment, the SAR ADC circuit may be similar to SAR ADC 100 of FIG. 1, SAR ADC 200 of FIG. 2 or SAR ADC as shown in FIGS. 3A-3DBB when the SAR ADC is implemented for a 5-bit digital bit conversion. Therefore, the details of components of the SAR ADC device will not be repeated in here for the sake of brevity. Furthermore, each of these steps may be performed through control signals provided by logic circuitry (e.g., logic circuitry 160 of FIG. 1 or logic circuitry 260 of FIG. 2).

At step 510, an input voltage (Vin) that is received by a SAR ADC device may be sampled by the capacitors within first and second binary-weighted capacitor arrays (hereinafter will be referred to as "arrays"). The Vin is a sampled voltage level of an analog signal at a particular instance. In one embodiment, the sampling occurs on the top-plates of capacitors within array that are coupled to the positive input terminal of comparator and on the bottom-plates of capacitors within the arrays that are coupled to the negative input terminal of comparator. In one embodiment, the comparator may be similar to comparator 140 of FIG. 1, comparator 240 of FIG. 2 or comparator 340 of FIGS. 3A-3DBB. Furthermore, total charges stored within the arrays are zero because the top and bottom-plates of capacitors are storing opposite polarity charges. In a conversion of an analog signal to 5-bit digital signal, the SAR ADC device may be configured similarly to the embodiment shown in FIG. 3A.

At step 520, the arrays within the SAR ADC are configured to be equivalent to a single-ended-to-differential converter circuit. The arrays may be configured to the single-ended-to-differential converter circuit by switching the bottom-plates of second array to the reference voltage instead of input voltage. Such switching may generate a voltage level of Vin on the positive terminal of comparator and a voltage level of Vref−Vin on the negative terminal of the comparator. In one exemplary embodiment, the SAR ADC device configured to be equivalent to the single-ended-to-differential converter circuit may be similar to the embodiment shown in FIG. 3B. When the voltage differences between the two input terminals of the comparator exceeds zero, the most significant bit of the digital signal is determined to be 1. However, when the voltage differences between the two input terminals of the comparator are zero or less than zero, the most significant bit of the digital signal is determined to be 0.

At step 530, when the most significant bit is determined to be '1', then voltage level at the most significant bit capacitor within the arrays are switched to their opposite voltage levels. In one embodiment, the switching may be similar to the ones by comparing embodiments of FIGS. 3B and 3CA. Such switching of the voltage levels may also be referred to as a most significant bit-cap advance switching. The purpose has been stated in the embodiment of FIG. 2, which is to provide a reference voltage level to the remaining capacitors within the array and avoid any kind of great transient voltages on the input terminals of the comparator.

However, when the most significant bit is determined to be '0', then the voltage levels at the most significant bit capacitors within the arrays remained as they previously were. In one embodiment, this may be seen by comparing the embodiments of FIGS. 3B and 3CB.

At step 540, the charges on the bottom-plates of capacitors of the arrays are averaged out. The charges are averaged out by configuring the SAR ADC device into the configuration shown in the embodiments of FIGS. 3DA and 3DB. In one embodiment, a phase that performs such averaging of charges on the bottom-plates may also be referred to as a bottom-plate charge-averaging phase. The voltages that are generated on the positive input terminal is Vin−Vref/2+Vref/4 and the voltages that are generated on the negative input terminal is 3Vref/2−Vref/4+Vin.

At step 550, the arrays are symmetrically switched to obtain remaining bits of the digital signal that represents the input voltage. The configuration of the arrays may be similar to FIGS. 3DAA-3DBB depending on the determination of previous two bits of the 5-bit digital signal. For example, when the first two most significant bits are 11, then the configuration may be similar to the ones as shown in FIG. 3DAA. In another example, when the first two most significant bits are 10, then the configuration may be similar to the ones as shown in FIG. 3DAB. In a third example, when the first two most significant bits are 01, then the configuration may be similar to the ones as shown in FIG. 3DBA. In a fourth example, when the first two most significant bits are 00, then the configuration may be similar to the ones as shown in FIG. 3DBB. Once the arrays are configured into such configuration, the $3^{rd}$ bit of digital signal may be determined. The manner in which is the $3^{rd}$ bit is determined is based on based on the differences of voltages across the input terminals at the comparator. Hence if the differences in voltages are greater than 0, then the $3^{rd}$ bit is determined to be 1. However, if the differences in voltages are less than or equal to 0, then the $3^{rd}$ bit is determined to be 0.

The step 550 may be performed continuously in sequential manner by disconnecting the couplings between a plate of the capacitor in one array from a plate of the capacitor in another array and connecting to a particular voltage terminal (i.e., a reference voltage level or a ground voltage level). Such configuration may then help to obtain the remaining bits of the digital signal for a particular analog signal.

The embodiments, thus far, were described with respect to circuits (e.g., an integrated circuit). The method and apparatus described herein may be incorporated into any suitable circuit. For example, the method and apparatus may be incorporated into numerous types of devices such as microprocessors or programmable logic devices.

The circuits are described herein may be part of a data processing system that includes one or more of the following components; a processor; memory; I/O circuitry; and peripheral devices. The data processing system can be used in a wide variety of applications, such as instrumentation, video processing, digital signal processing, or any suitable other application. Furthermore, the circuit can also be used to perform a variety of different logic functions. For example, the circuit can be configured as a processor or controller that works in cooperation with a system processor.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. Analog-to-digital converter (ADC) circuitry, comprising:
   first and second binary-weighted capacitor arrays, wherein each first and second binary-weighted capacitor array is having a total capacitance of $2^{n-2}C$, wherein n represents a number of bits of a digital signal representing an analog signal;
   a comparator circuit having first and second terminals, wherein the first terminal is coupled to the first binary-weighted capacitor array, and the second terminal is coupled to the second binary weighted capacitor array; and
   a switching circuit within the second binary-weighted capacitor array is configurable to couple a largest capacitance capacitor within the second binary-weighted capacitor array from remaining capacitors within the second binary weighted capacitor array.

2. The ADC circuitry of claim 1, wherein the first binary-weighted capacitor array includes a plurality of capacitors arranged parallel to each other, wherein capacitances for the capacitors are based on a sequence that follows $2^{n-m}$, where a value of the m decreases from m=n to m=3.

3. The ADC circuitry of claim 2, wherein the second binary-weighted capacitor array includes another plurality of capacitors arranged parallel to each other, wherein capacitance for the capacitors in the another plurality of capacitors are based on a sequence that follows $2^{n-m}$, where a value of m decreases from m=n to m=3.

4. The ADC circuitry of claim 3, wherein the value of n=10 and the values of the m ranges from 10 to 3.

5. The ADC circuitry of claim 3, wherein the capacitors within the plurality of capacitors in the first and second binary-weighted capacitor array having capacitance values greater than a predetermined capacitance value are further divided into a plurality of capacitors having a smaller capacitance than the predetermined capacitance value.

6. The ADC circuitry of claim 1, further comprising:
   a first plurality of switches that are formed within the first binary-weighted capacitor and are in parallel to their corresponding capacitors, wherein each switch within the first plurality of switches is coupled to a first plate of their respective capacitor, and wherein the switch is controllable to supply a selected voltage level from a group of voltage levels consisting of a reference voltage level and a ground voltage level; and
   a second plurality of switches that are formed within the second binary-weighted capacitor and are in parallel to their corresponding capacitors, wherein each switch within the second plurality of switches is coupled to a first plate of their respective capacitor, and wherein the switch is controllable to supply a selected voltage level from a group of voltage levels consisting of the reference voltage level and the ground voltage level.

7. The ADC circuitry of claim 6, further comprising:
   a third plurality of switches that are formed between the first plate of the capacitors within the first binary-weighted capacitors and the first plate of the capacitors forming the second binary-weighted capacitors.

8. The ADC circuitry of claim 7, further comprising:
   logic circuitry that is coupled to the first and second binary-weighted capacitor arrays, wherein the logic circuitry controls the first, second and third plurality of switches.

9. A circuitry, comprising:
   first and second binary-weighted capacitor arrays, wherein the first and second binary-weighted capacitor array is symmetrical in design with respect to each other;
   a comparator circuit having first and second terminals, wherein the first terminal is coupled to the first binary-weighted capacitor array, and the second terminal is coupled to the second binary weighted capacitor array; and
   a switching circuit within the second binary-weighted capacitor array that is configurable to provide a fixed reference voltage level for the remaining capacitors within the second binary-weighted capacitor array.

10. The circuitry of claim 9, wherein the switching circuit is located in between and in a serial connection with a capacitor having a largest capacitances and remaining capacitors.

11. The circuitry of claim 9, wherein the first and second binary-weighted capacitor arrays are supplied with a reference voltage level (VREF), an input voltage level (VIN) and a ground voltage level (GND).

12. The circuitry of claim 11, wherein a logic high bit is generated when voltage differences between the first and second terminals is greater than zero, and wherein a logic low bit is generated when the voltage differences between the first and second terminals is less than equal to zero.

13. The circuitry of claim 11, wherein the fixed reference voltage is VREF/2 when the switching circuit is switched-on.

14. The circuitry of claim 11, wherein the circuitry forms part of a prosthesis apparatus.

15. A method of operating a successive approximation register (SAR) analog-to-digital converter (ADC) having first and second binary-weighted capacitor arrays, and receiving an input voltage (Vin), a reference voltage level (Vref) and a ground voltage level, wherein the method comprising:
   sampling the input voltage of an analog signal on capacitors formed within the first and second binary-weighted capacitor arrays;

configuring the first and second binary-weighted capacitor arrays to an equivalent single-ended-to-differential converter circuit; and when a most significant bit (MSB) is determined to be a logic high bit, switching a most significant bit capacitor to provide a reference voltage to remaining capacitors in the second binary-weighted capacitor array.

16. The method of claim 15, wherein the sampling of the input voltage further comprises:

storing charges on a first plate of the capacitors in the first binary-weighted capacitor arrays for at least an amount that reflects the input voltage; and storing charges on a first plate of the capacitors in the second binary-weighted capacitor array for at least an amount that reflects the input voltage.

17. The method of claim 15, further comprising, when the first and second binary-weighted capacitor arrays are configured to an equivalent single-ended-to-differential converter circuit, generating 2Vin−Vref voltages across the input terminals of a comparator within the SAR ADC.

18. The method of claim 15, further comprising:

averaging the charges on a bottom-plates of capacitors within the first and second binary-weighted capacitor arrays.

19. The method of claim 15, further comprising:

after configuring the first and second binary-weighted capacitor arrays to the equivalent single-ended-to-differential converter circuit, determining a most significant bit (MSB) of the digital signal that represents the input voltage.

20. The method of claim 15, further comprising:

switching symmetrically the first and second binary-weighted capacitor arrays to obtain the remaining bits of the digital signal that represent the input signal.

* * * * *